(12) United States Patent
Song et al.

(10) Patent No.: US 12,289,971 B2
(45) Date of Patent: Apr. 29, 2025

(54) DISPLAY SUBSTRATE AND DISPLAY DEVICE THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Liang Song, Beijing (CN); Jiahao Xu, Beijing (CN); Dongliang Lu, Beijing (CN); Fei Liao, Beijing (CN); Donghua Jiang, Beijing (CN); Guobo Yang, Beijing (CN); Pengyu Liao, Beijing (CN); Wuyang Zhao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 533 days.

(21) Appl. No.: 17/789,948

(22) PCT Filed: Aug. 5, 2021

(86) PCT No.: PCT/CN2021/110793
§ 371 (c)(1),
(2) Date: Jun. 29, 2022

(87) PCT Pub. No.: WO2022/068388
PCT Pub. Date: Apr. 7, 2022

(65) Prior Publication Data
US 2023/0050620 A1 Feb. 16, 2023

(30) Foreign Application Priority Data
Sep. 29, 2020 (CN) .......................... 202011048231.1

(51) Int. Cl.
*H10K 59/131* (2023.01)
*H10D 86/60* (2025.01)

(52) U.S. Cl.
CPC ................................. *H10K 59/131* (2023.02)

(58) Field of Classification Search
CPC .... H10K 59/131; H10D 86/443; H10D 86/60; H10D 86/021
See application file for complete search history.

(56) References Cited

U.S. PATENT DOCUMENTS

| | | | | |
|---|---|---|---|---|
| 2010/0065842 | A1* | 3/2010 | Yamazaki | H10D 86/441 257/E21.414 |
| 2012/0161820 | A1* | 6/2012 | Koo | H10D 86/021 438/34 |

(Continued)

FOREIGN PATENT DOCUMENTS

| CN | 104503177 A | 4/2015 |
|---|---|---|
| CN | 106249932 A | 12/2016 |

(Continued)

OTHER PUBLICATIONS

Office Action issued for Chinese Application No. 202011048231.1, malled on Feb. 22, 2022, 17 pages.

*Primary Examiner* — Omar F Mojaddedi
(74) *Attorney, Agent, or Firm* — Raj S. Davé; Dave Law Group, LLC

(57) ABSTRACT

The present disclosure relates to a display substrate and a display device thereof. The display substrate comprises: a substrate; a first wiring extending in a first direction on the substrate; a first dielectric layer on the substrate and the first wiring; a second wiring extending in the first direction on the first dielectric layer, wherein an orthographic projection of the second wiring on the substrate at least partially overlaps with an orthographic projection of the first wiring on the substrate; a conformal dielectric layer on the first dielectric (Continued)

layer and the second wiring; a third wiring and a fourth wiring disposed at spacings in the first direction on the conformal dielectric layer, wherein orthographic projections of the third wiring and the fourth wiring on the substrate at least partially overlap with the orthographic projections of the first wiring and the second wiring on the substrate.

20 Claims, 6 Drawing Sheets

(56) References Cited

U.S. PATENT DOCUMENTS

| | | | | |
|---|---|---|---|---|
| 2013/0168707 | A1* | 7/2013 | Huang | H10D 86/021 |
| | | | | 257/E21.409 |
| 2016/0216820 | A1* | 7/2016 | Sung | G06F 3/0412 |
| 2016/0307920 | A1* | 10/2016 | Chen | H10D 86/443 |
| 2020/0006401 | A1* | 1/2020 | Hwang | G09G 3/3225 |
| 2020/0350337 | A1* | 11/2020 | Chi | H10D 86/60 |

FOREIGN PATENT DOCUMENTS

| | | |
|---|---|---|
| CN | 106775124 A | 5/2017 |
| CN | 107123634 A | 9/2017 |
| CN | 108646483 A | 10/2018 |
| CN | 112271192 A | 1/2021 |
| WO | 2012147629 A1 | 11/2012 |

* cited by examiner

DISPLAY SUBSTRATE AND DISPLAY DEVICE THEREOF

CROSS REFERENCE TO RELATED APPLICATIONS

This patent application is the national stage entry of International Application no.: PCT/CN2021/110793, filed on Aug. 5, 2021, which claims the benefit and priority of Chinese Patent Application No. 202011048231.1 filed on Sep. 29, 2020, the disclosures of which are incorporated by reference herein in their entirety as part of the present application.

TECHNICAL FIELD

Embodiments of the present disclosure relate to a field of displaying technology, and particularly, relate to a display substrate and a display device thereof.

BACKGROUND

Organic Light-Emitting Diode (OLED) display panels have advantages such as self-luminescence, high efficiency, bright colors, light weight, power saving, capability of crimping, and a wide operating temperature range, and have been gradually applied to fields such as large-area displaying, lighting, and onboard displaying.

SUMMARY

Embodiments of the present disclosure provide a display substrate and a display device thereof.

In an aspect of the present disclosure, a display substrate is provided. The display substrate comprises: a substrate; a first wiring extending in a first direction on the substrate; a first dielectric layer on the substrate and the first wiring; a second wiring extending in the first direction on the first dielectric layer, wherein an orthographic projection of the second wiring on the substrate at least partially overlaps with an orthographic projection of the first wiring on the substrate; a conformal dielectric layer on the first dielectric layer and the second wiring; a third wiring and a fourth wiring disposed at spacings in the first direction on the conformal dielectric layer, wherein orthographic projections of the third wiring and the fourth wiring on the substrate at least partially overlap with the orthographic projections of the first wiring and the second wiring on the substrate.

In an embodiment of the present disclosure, the substrate has a display region and a peripheral region surrounding the display region. The first wiring, the second wiring, the third wiring, and the fourth wiring are located in corner regions of the peripheral region.

In an embodiment of the present disclosure, the third wiring and the fourth wiring extend in parallel in a second direction different from the first direction.

In an embodiment of the present disclosure, the first direction intersects with and isn't perpendicular to the second direction.

In an embodiment of the present disclosure, the first wiring and the second wiring are configured to provide data signals representing display information to the display substrate.

In an embodiment of the present disclosure, the display substrate further comprises an integrated circuit in the peripheral region. One end of the first wiring and one end of the second wiring are coupled to the integrated circuit. Another end of the first wiring and another end of the second wiring are coupled to data signal lines of the display substrate.

In an embodiment of the present disclosure, the third wiring and the fourth wiring are configured to provide scan signals to the display substrate.

In an embodiment of the present disclosure, the display substrate further comprises a gate driving circuit in the peripheral region. One end of the third wiring and one end of the fourth wiring are coupled to the gate driving circuit. Another end of the third wiring and another end of the fourth wiring are coupled to scan signal lines of the display substrate.

In an embodiment of the present disclosure, a first dimension of the first wiring in a direction perpendicular to its extending direction is the same as a second dimension of the second wiring in a direction perpendicular to its extending direction.

In an embodiment of the present disclosure, the first dimension is greater than twice a sum of a masking error of a mask used for forming the first wiring or the second wiring and an over-etching error of an etching used for forming the first wiring or the second wiring.

In an embodiment of the present disclosure, the first wiring comprises a first portion and a second portion. An orthographic projection of the first portion on the substrate does not overlap with an orthographic projection of the second wiring on the substrate. The orthographic projection of the second portion on the substrate overlaps with the orthographic projection of the second wiring on the substrate. A third dimension of the second portion in a direction perpendicular to an extending direction of the first wiring is greater than the sum of the masking error and the over-etching error.

In an embodiment of the present disclosure, the third dimension is one-half of the first dimension.

In an embodiment of the present disclosure, the first dimension is 2.0 μm.

In an embodiment of the present disclosure, the display substrate further comprises: a barrier layer between the substrate and the first wiring; a buffer layer between the barrier layer and the first wiring; a planarization layer on the conformal dielectric layer and the third wiring; and a pixel definition layer on the planarization layer.

In an aspect of the present disclosure, a display device is provided. The display device comprises the display substrate as described above.

Further aspects and areas of applicability will become apparent from the description provided herein. It should be understood that various aspects of the present application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several diagrams of the drawings.

DETAILED DESCRIPTION

Figure 1:
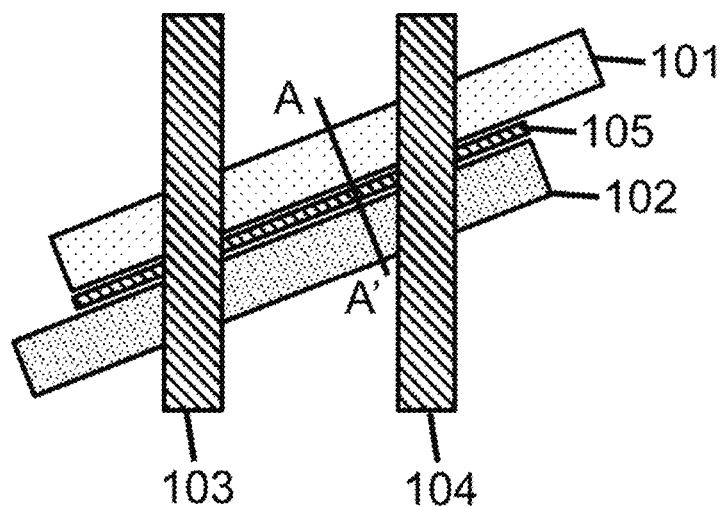
FIG. 1 schematically shows a portion of a plan structural view of a corner region of a display substrate.

Firstly, it should be noted that, as used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

Next, in the drawings, the thickness and area of each layer are exaggerated for clarity. It should be understood that when a layer, a region, or a component is referred to as being "on" another part, it is meant that it is directly on the another part, or there may be other components in between. In contrast, when a certain component is referred to as being "directly" on another component, it is meant that no other component lies in between.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

Exemplary embodiments will now be described more fully with reference to the accompanying drawings.

Figure 2:
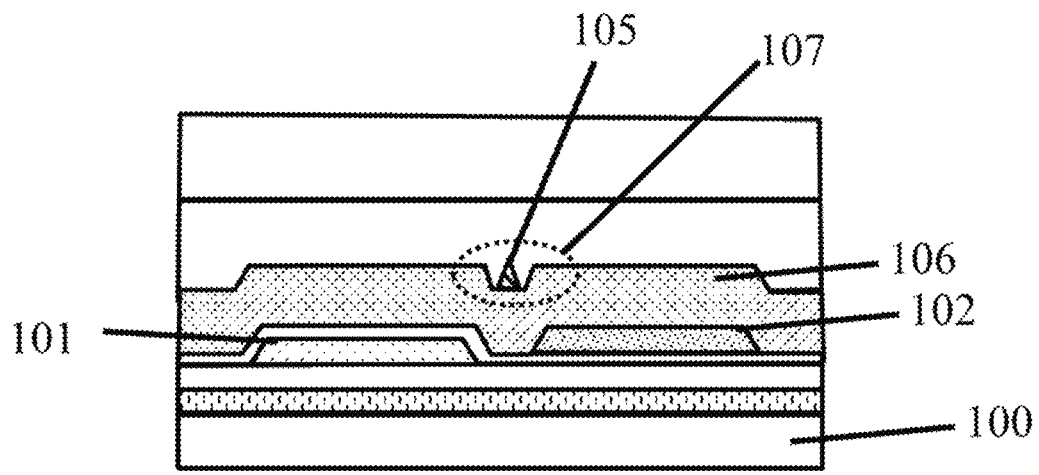
FIG. 2 schematically shows a cross-sectional view taken along the line AA' in FIG. 1.

FIG. 1 schematically shows a portion of a plan structural view of a corner region of a display substrate. FIG. 2 schematically shows a cross-sectional view taken along the line AA' in FIG. 1. As shown in FIGS. 1 and 2, the display substrate includes a substrate 100 and a first wiring 101 and a second wiring 102 on the substrate 100. Since the first wiring 101 and the second wiring 102 are disposed as spacings, when a dielectric layer 106 is conformally formed on the first wiring 101 and the second wiring 102, the dielectric layer 106 will follow a surface shape of the underlying structure, and thus a recess 107 is formed on a surface of the dielectric layer 106. In this case, when a third wiring 103 and a fourth wiring 104 are subsequently formed on the dielectric layer 106, a material for forming the third wiring 103 and the fourth wiring 104 may undesirably remain within the recess 107, and thus a residual portion 105 is formed. This residual portion 105 may cause a short circuit between the third wiring 103 and the fourth wiring 104. As a result, an abnormal display phenomenon of always emitting white light occurs in a corner region and corresponding frame region of the display substrate.

Figure 3:
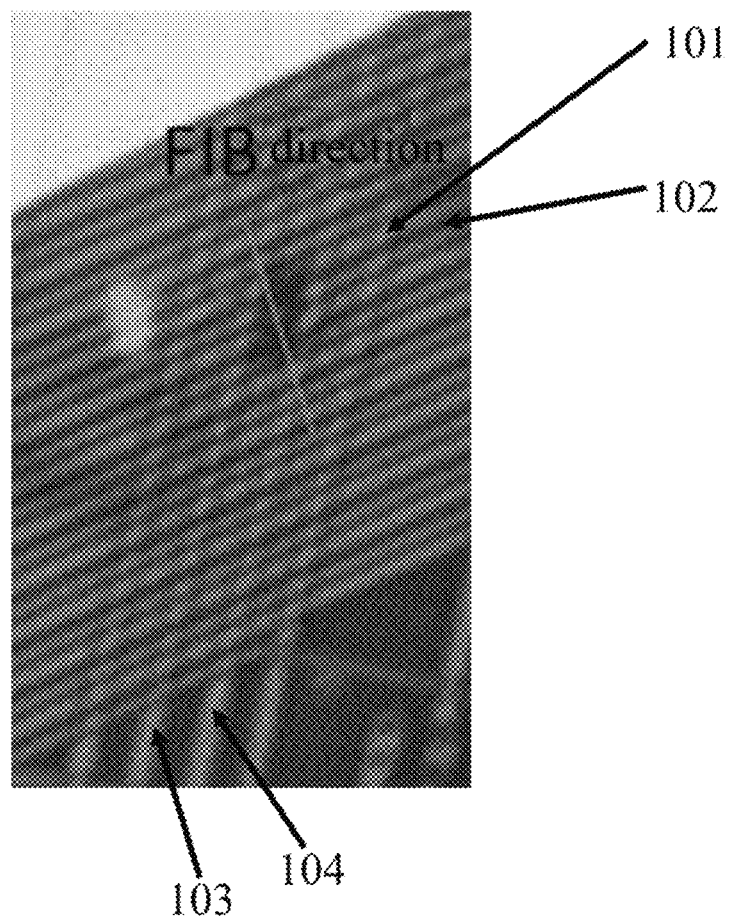
FIG. 3 shows a photograph of a portion of wirings in a corner region of a real display substrate.
Figure 4:
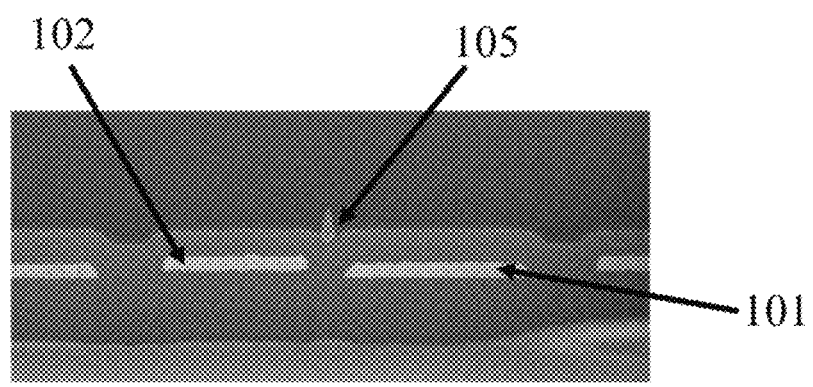
FIG. 4 shows a cross-sectional view of a display panel taken along a FIB direction in FIG. 3.

In this regard, FIGS. 3-4 show actual photographs of a real display panel and a real display screen, which more clearly illustrate the above problems. FIG. 3 shows a photograph of a portion of wirings in a corner region of a real display substrate. As shown in FIG. 3, the third wiring 103 and the fourth wiring 104 are short-circuited at a position indicated by a direction of a Focus Ion Beam (FIB) in the drawing. FIG. 4 shows a cross-sectional view of a display panel taken along a FIB direction in FIG. 3. The positional relationship among the first wiring 101, the second wiring 102 and a material portion 105 in FIG. 4 is similar to that in FIG. 2, and will not be repeated here.

Embodiments of the present disclosure provide a display substrate capable of avoiding the abnormal displaying phenomenon in a corner region and a frame region of the display substrate caused by a short circuit between wirings.

Figure 5:
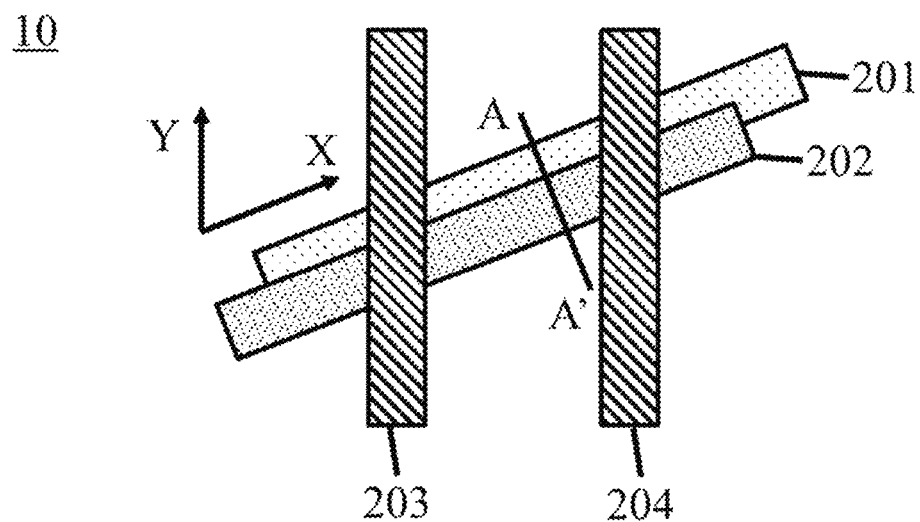
FIG. 5 shows a portion of a plan structural view of a display substrate according to an embodiment of the present disclosure.
Figure 6:
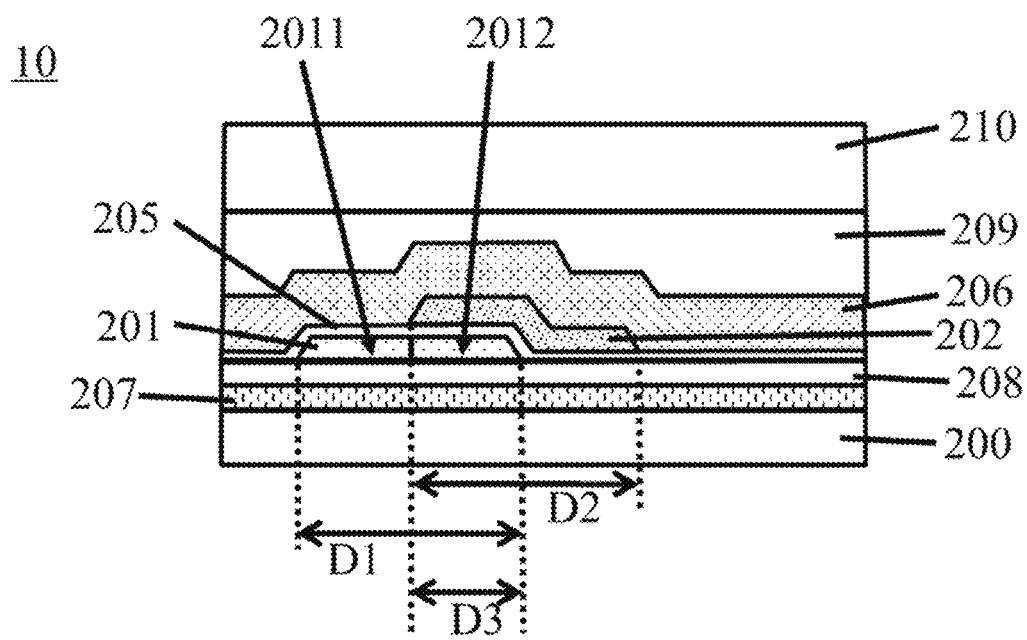
FIG. 6 shows a cross-sectional structural view taken along the line AA' in FIG. 5 according to an embodiment of the present disclosure.

FIG. 5 shows a portion of a plan structural view of a display substrate according to an embodiment of the present disclosure. FIG. 6 shows a cross-sectional structural view taken along the line AA' in FIG. 5 according to an embodiment of the present disclosure.

As shown in FIGS. 5 and 6, the display substrate 10 may include: a substrate 200; a first wiring 201 extending in a first direction X on the substrate 200; a first dielectric layer 205 on the substrate 200 and the first wiring 201; and a second wiring 202 extending in the first direction X on the first dielectric layer 205. Referring to FIG. 6, an orthographic projection of the second wiring 202 on the substrate 200 may at least partially overlap with an orthographic projection of the first wiring 201 on the substrate 200.

With continued reference to FIGS. 5 and 6, the display substrate 10 may further include: a conformal dielectric layer 206 on the first dielectric layer 205 and the second wiring 202; and a third wiring 203 and a fourth wiring 204 disposed at spacings in the first direction X on the conformal dielectric layer 206 (shown only in FIG. 5). Orthographic projections of the third wiring 203 and the fourth wiring 204 on the substrate 200 may at least partially overlap with the orthographic projections of the first wiring 201 and the second wiring 202 on the substrate 200.

In the embodiment of the present disclosure, since the orthographic projection of the second wiring 202 on the substrate 200 at least partially overlaps with the orthographic projection of the first wiring 201 on the substrate 200, the recess 107 as shown in FIG. 2 is not formed on a surface of the conformal dielectric layer 206 so that the third wiring 203 and the fourth wiring 204 formed on the conformal dielectric layer 206 will not be short-circuited, thereby avoiding the abnormal displaying phenomenon and then improving the display effect of the display substrate.

Continuing with reference to FIG. 5, the third wiring 203 and the fourth wiring 204 may extend in parallel in a second direction Y different from the first direction X. In an embodiment of the present disclosure, the first direction X may intersect with and be not perpendicular to the second direction Y.

In an embodiment of the present disclosure, referring to FIG. 6, a first dimension D1 of the first wiring 201 in a direction perpendicular to its extending direction may be the same as a second dimension D2 of the second wiring 202 in a direction perpendicular to its extending direction.

In an embodiment of the present disclosure, the first dimension D1 is greater than twice a sum of a masking error of a mask used for forming the first wiring 201 or the second wiring 202 and an over-etching error of an etching used for forming the first wiring 201 or the second wiring 202.

Figure 7:
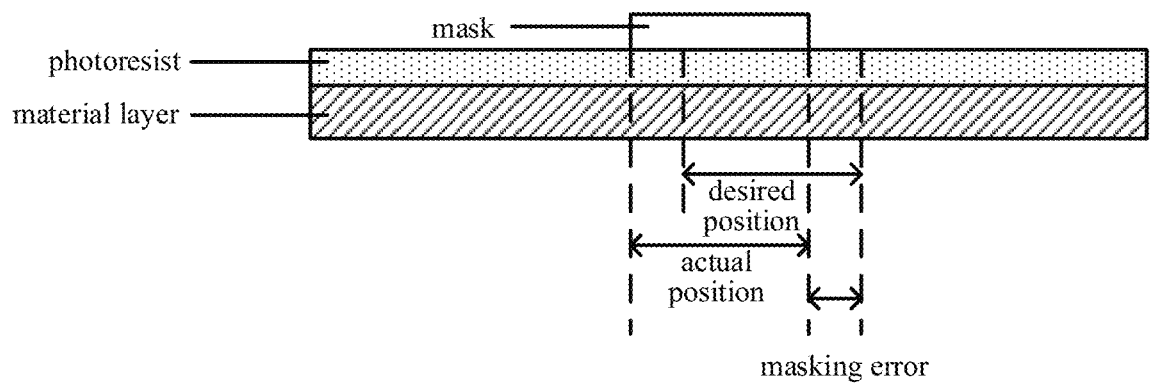
FIG. 7 shows a schematic view of a masking error.

FIG. 7 shows a schematic view of a masking error. A material layer in FIG. 7 is, for example, a raw material layer for forming the first wiring 201 or the second wiring 202. In order to form the first wiring 201 or the second wiring 202, a photoresist needs to be formed on the material layer, and then the photoresist is exposed by using a mask followed by a step of etching the material layer, thereby obtaining the first wiring 201 or the second wiring 202. FIG. 7 actually shows a process of performing mask alignment. As shown in FIG. 7, the mask should be located at a position corresponding to a desired position. However, the actual position of the mask is offset relative to the desired position. This relative offset is called as the masking error.

In an exemplary embodiment of the present disclosure, the masking error may be, for example, 0.6 μm.

Figure 8:
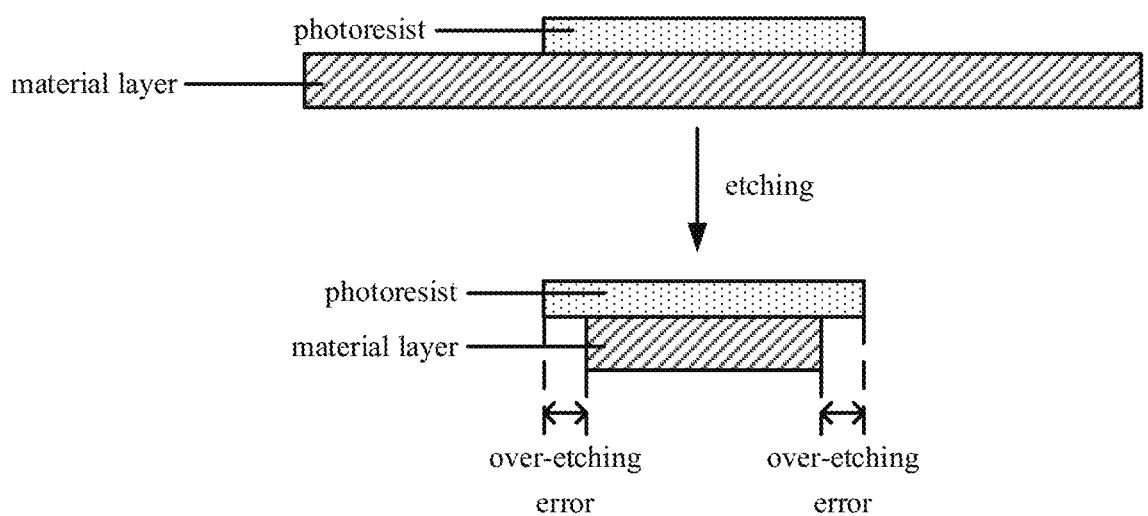
FIG. 8 shows a schematic view of an over-etching error.

FIG. 8 shows a schematic view of an over-etching error. When an etching step is performed on the material layer based on the exposed photoresist, an over-etching of the material layer may occur. Therefore, the over-etching error as shown in FIG. 8 will be produced.

In an exemplary embodiment of the present disclosure, the over-etching error may be, for example, 0.1 μm.

In an embodiment of the present disclosure, referring to FIG. 6, the first wiring 201 may include a first portion 2011 and a second portion 2012. An orthographic projection of the first portion 2011 on the substrate 200 may not overlap with the orthographic projection of the second wiring 202 on the substrate 200. An orthographic projection of the second portion 2012 on the substrate 200 may overlap with the orthographic projection of the second wiring 202 on the substrate 200.

In an embodiment of the present disclosure, a third dimension D3 of the second portion 2012 in a direction perpendicular to an extending direction of the first wiring 201 may be greater than the sum of the masking error and the over-etching error. As an example, the third dimension D3 may be greater than 0.7 μm. In an exemplary embodiment of the present disclosure, the third dimension D3 may be one-half of the first dimension D1.

As an example, the first dimension D1 may be 2.0 μm. The second dimension D2 may be 2.0 μm. The dimension D3 may be 1.0 μm.

Figure 9:
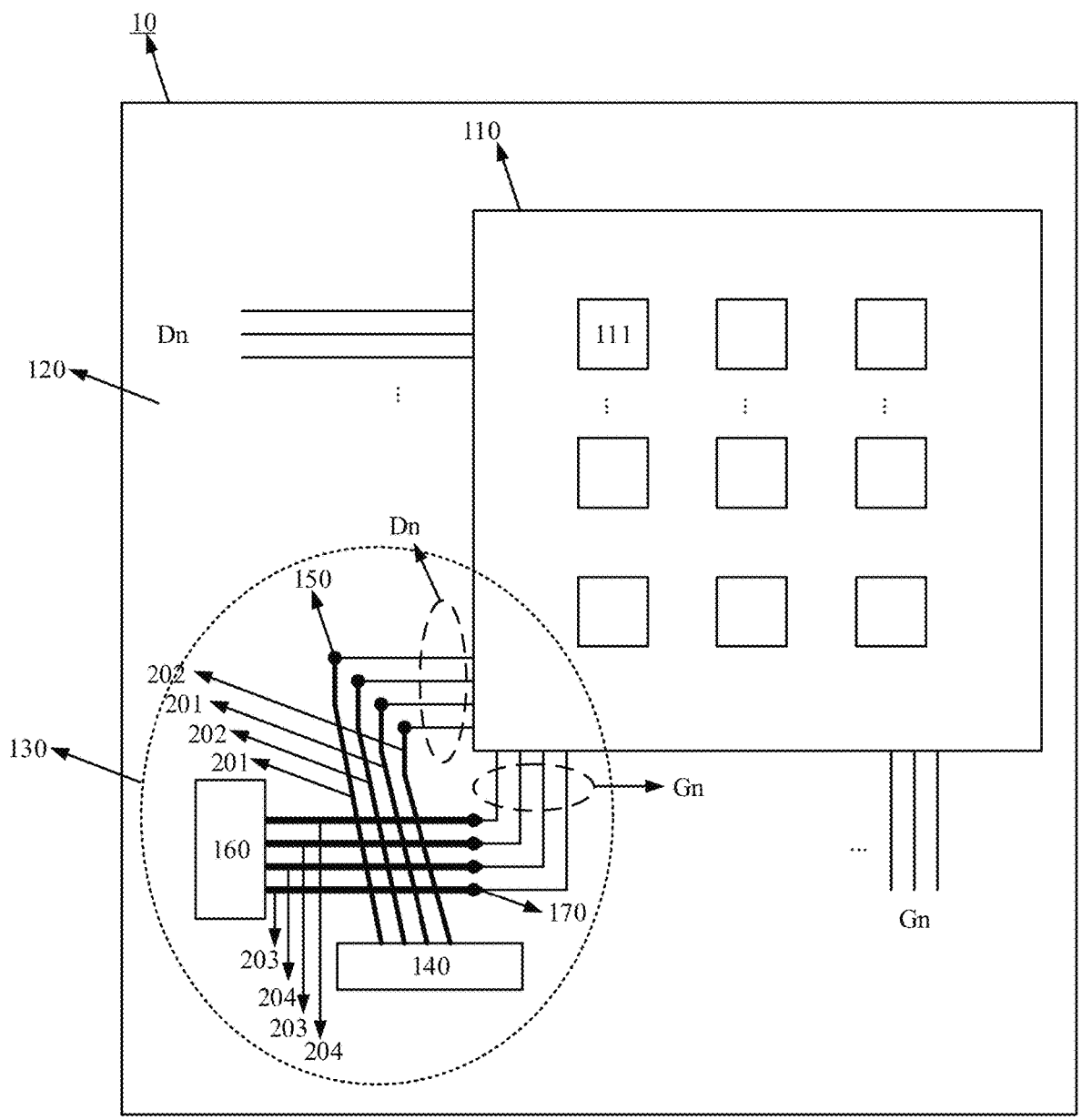
FIG. 9 shows a schematic plan structural view of a display substrate according to an embodiment of the present disclosure.

FIG. 9 shows a schematic plan structural view of a display substrate according to an embodiment of the present disclosure. As shown in FIG. 9, the substrate may have a display region 110 and a peripheral region 120 surrounding the display region 110. A plurality of pixels 111 configured to display may be provided within the display region 110. The peripheral region 120 may include corner regions 130.

In an embodiment of the present disclosure, the first wiring 201, the second wiring 202, the third wiring 203 and the fourth wiring 204 as shown in FIGS. 5 and 6 may be located in the corner regions 130.

It should be understood that, in the embodiment of the present disclosure, the first wiring 201 and the second wiring 202 may overlap with each other, so that in a direction perpendicular to the extending direction of the first wiring 201 and the second wiring 202, there is no spacing between the first wiring 201 and the second wiring 202. Thus, compared with the first wiring 101 and the second wiring 202 shown in FIG. 2, the embodiment of the present disclosure reduces the spacing between the wirings, thereby making it possible to narrow the frame of the display substrate.

It should be noted that, in order to describe the embodiments of the present disclosure more clearly and explicitly, FIG. 5 only shows four wirings, i.e., the first wiring 201, the second wiring 202, the third wiring 203 and the fourth wiring 204. Actually, as shown in FIG. 9, the display substrate 10 may include a plurality of first wirings 201, a plurality of second wirings 202, a plurality of third wirings 203 and a plurality of fourth wirings 204.

In addition, in FIG. 9, the overlapping relationship between the first wiring 201 and the second wiring 202 is not shown. It should be understood that the overlapping relationship between the first wiring 201 and the second wiring 202 is as shown in FIGS. 5 and 6. FIG. 9 merely schematically depicts the layout of the wiring.

In addition, the corner region 130 in FIG. 9 are not drawn to scale, but are shown enlarged to clearly illustrate the wiring layout within the corner regions 130 of the display substrate 10, which cannot be regarded as a limitation to the present disclosure.

In an embodiment of the present disclosure, the first wiring 201 and the second wiring 202 may be configured to provide data signals representing display information to the display substrate 10.

Continuing with reference to FIG. 9, the display substrate 10 may further include an integrated circuit 140 in the peripheral region 120. One end of the first wiring 201 and one end of the second wiring 202 may be coupled to the integrated circuit 140. Another end of the first wiring 201 and another end of the second wiring 202 may be coupled to data signal lines Dn of the display substrate 10. For example, another end of the first wiring 201 and another end of the second wiring 202 may be coupled to the data signal lines Dn at different levels through vias 150. As an example, the data signal line Dn may represent a signal line for transmitting the data signals representing the display information to the pixel 111. The data signal may comprise, for example, a voltage signal.

In an embodiment of the present disclosure, the third wiring 203 and the fourth wiring 204 may be configured to provide scan signals to the display substrate.

Continuing with reference to FIG. 9, the display substrate 10 may further include a gate driving circuit 160 in the peripheral region 120. One end of the third wiring 203 and one end of the fourth wiring 204 may be coupled to the gate driving circuit 160. Another end of the third wiring 203 and another end of the fourth wiring 204 may be coupled to scan signal lines Gn of the display substrate 10. For example, another end of the third wiring 203 and another end of the fourth wiring 204 may be coupled to the scan signal lines Gn at different levels through vias 170. As an example, the scan signal line Gn may represent a signal line for transmitting scan signals for driving the pixel 111 to the pixel 111. The scan signal may comprise a voltage, for example.

In an embodiment of the present disclosure, referring to FIG. 6 again, the display substrate 10 may further include: a barrier layer 207 between the substrate 200 and the first wiring 201; a buffer layer 208 between the barrier layer 207 and the first wiring 201; a planarization layer 209 on the conformal dielectric layer 206, the third wiring 203 and the fourth wiring 204 (not shown in FIG. 6); and a pixel definition layer 210 on the planarization layer 209.

Figure 10:
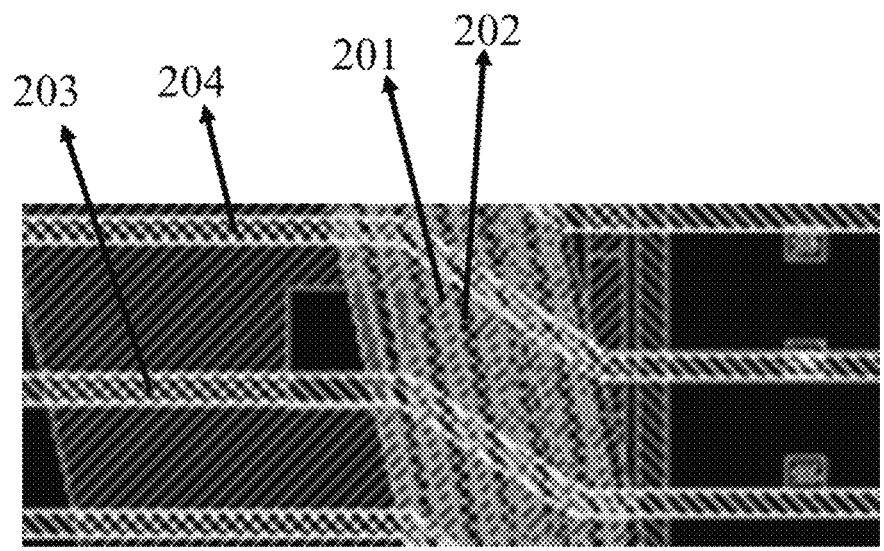
FIG. 10 shows a portion of wiring layout view of a corner region of a display substrate according to an embodiment of the present disclosure.

FIG. 10 shows a portion of wiring layout view of a corner region of a display substrate according to an embodiment of the present disclosure. In FIG. 10, no short circuit occurs between the third wiring 203 and the fourth wiring 204.

Figure 11:
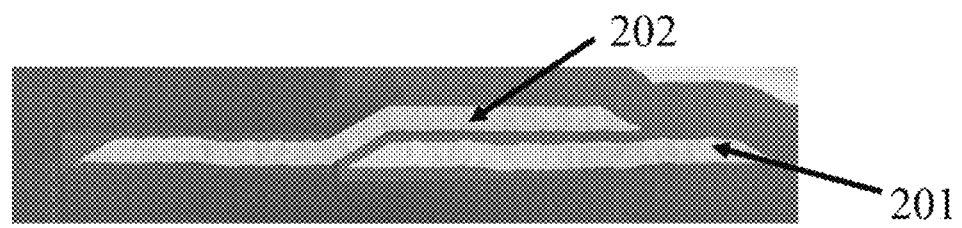
FIG. 11 shows a FIB cross-sectional view of a first wiring and a second wiring in a corner region of a display substrate according to an embodiment of the present disclosure.

FIG. 11 shows a FIB cross-sectional view of a first wiring and a second wiring in a corner region of a display substrate according to an embodiment of the present disclosure. The positional relationship between the first wiring 201 and the second wiring 202 shown in FIG. 11 is similar to that shown in FIG. 6, and will not be repeated here.

In an embodiment of the present disclosure, a display device is further provided. The display device may include the display substrate as described above. For example, the display device may include a display panel. As an example, the display device may be, for example, an OLED display device. As other examples, the display device may be, for example, a mobile phone, a tablet computer, a television, a monitor, a notebook computer, a navigator, a wearable device, an e-book reader, and the like.

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. A display substrate, comprising:
    a substrate;
    a first wiring extending in a first direction on the substrate;
    a first dielectric layer on the substrate and the first wiring;
    a second wiring extending in the first direction on the first dielectric layer, wherein an orthographic projection of the second wiring on the substrate at least partially overlaps with an orthographic projection of the first wiring on the substrate;
    a conformal dielectric layer on the first dielectric layer and the second wiring;
    a third wiring and a fourth wiring disposed at spacings in the first direction on the conformal dielectric layer, wherein orthographic projections of the third wiring and the fourth wiring on the substrate at least partially overlap with the orthographic projections of the first wiring and the second wiring on the substrate.

2. The display substrate according to claim 1, wherein the substrate has a display region and a peripheral region surrounding the display region,
    the first wiring, the second wiring, the third wiring, and the fourth wiring are located in corner regions of the peripheral region.

3. The display substrate according to claim 1, wherein the third wiring and the fourth wiring extend in parallel in a second direction different from the first direction.

4. The display substrate according to claim 3, wherein the first direction intersects with and isn't perpendicular to the second direction.

5. The display substrate according to claim 4, wherein the first wiring and the second wiring are configured to provide data signals representing display information to the display substrate.

6. The display substrate according to claim 5, further comprising an integrated circuit in the peripheral region,
    wherein one end of the first wiring and one end of the second wiring are coupled to the integrated circuit,
    another end of the first wiring and another end of the second wiring are coupled to data signal lines of the display substrate.

7. The display substrate according to claim 5, wherein the third wiring and the fourth wiring are configured to provide scan signals to the display substrate.

8. The display substrate according to claim 7, further comprising a gate driving circuit in the peripheral region,
    wherein one end of the third wiring and one end of the fourth wiring are coupled to the gate driving circuit,
    another end of the third wiring and another end of the fourth wiring are coupled to scan signal lines of the display substrate.

9. The display substrate according to claim 1, wherein a first dimension of the first wiring in a direction perpendicular to its extending direction is the same as a second dimension of the second wiring in a direction perpendicular to its extending direction.

10. The display substrate according to claim 9, wherein the first dimension is greater than twice a sum of a masking error of a mask used for forming the first wiring or the second wiring and an over-etching error of an etching used for forming the first wiring or the second wiring.

11. The display substrate according to claim 10, wherein the first wiring comprises a first portion and a second portion, and an orthographic projection of the first portion on the substrate does not overlap with an orthographic projection of the second wiring on the substrate, and the orthographic projection of the second portion on the substrate overlaps with the orthographic projection of the second wiring on the substrate,
    wherein a third dimension of the second portion in a direction perpendicular to an extending direction of the first wiring is greater than the sum of the masking error and the over-etching error.

12. The display substrate according to claim 11, wherein the third dimension is one-half of the first dimension.

13. The display substrate according to claim 9, wherein the first dimension is 2.0 µm.

14. The display substrate according to claim 1, further comprising:
    a barrier layer between the substrate and the first wiring;
    a buffer layer between the barrier layer and the first wiring;
    a planarization layer on the conformal dielectric layer and the third wiring; and
    a pixel definition layer on the planarization layer.

15. A display device comprising the display substrate according to claim 1.

16. The display substrate according to claim 2, wherein a first dimension of the first wiring in a direction perpendicular to its extending direction is the same as a second dimension of the second wiring in a direction perpendicular to its extending direction.

17. The display substrate according to claim 3, wherein a first dimension of the first wiring in a direction perpendicular to its extending direction is the same as a second dimension of the second wiring in a direction perpendicular to its extending direction.

18. The display substrate according to claim 4, wherein a first dimension of the first wiring in a direction perpendicular to its extending direction is the same as a second dimension of the second wiring in a direction perpendicular to its extending direction.

19. The display substrate according to claim 5, wherein a first dimension of the first wiring in a direction perpendicular to its extending direction is the same as a second dimension of the second wiring in a direction perpendicular to its extending direction.

20. The display substrate according to claim 6, wherein a first dimension of the first wiring in a direction perpendicular to its extending direction is the same as a second dimension of the second wiring in a direction perpendicular to its extending direction.

* * * * *